US010746438B2

(12) United States Patent
Kim et al.

(10) Patent No.: US 10,746,438 B2
(45) Date of Patent: Aug. 18, 2020

(54) NANOWIRE BUNDLE ARRAY, MEMBRANE INCLUDING THE SAME, METHOD OF MANUFACTURING THE MEMBRANE, AND STEAM GENERATOR USING THE MEMBRANE

(71) Applicant: INDUSTRY-ACADEMIC COOPERATION FOUNDATION, YONSEI UNIVERSITY, Seoul (KR)

(72) Inventors: Kyoung Sik Kim, Seoul (KR); Kyu Young Bae, Seoul (KR); Gu Min Kang, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 703 days.

(21) Appl. No.: 15/335,821

(22) Filed: Oct. 27, 2016

(65) Prior Publication Data

US 2017/0146263 A1 May 25, 2017

(30) Foreign Application Priority Data

Nov. 20, 2015 (KR) ........................ 10-2015-0162920

(51) Int. Cl.
*F24S 10/00* (2018.01)
*F24S 10/80* (2018.01)
(Continued)

(52) U.S. Cl.
CPC .......... *F24S 10/80* (2018.05); *C23C 14/0005* (2013.01); *C23C 14/185* (2013.01);
(Continued)

(58) Field of Classification Search
CPC ... F24S 10/80; C25F 3/20; D01F 9/08; D06M 11/83; F22B 1/006; C23C 14/0005;
(Continued)

(56) References Cited

U.S. PATENT DOCUMENTS

| 7,898,658 B2 * | 3/2011 | Moskovits | ........... G01N 21/658 356/301 |
| 2008/0115817 A1 * | 5/2008 | Defries | ................... H02S 99/00 126/574 |

(Continued)

FOREIGN PATENT DOCUMENTS

KR   10-2008-0003997 A    1/2008

OTHER PUBLICATIONS

Xiao et al. "Controlled Electrochemical Synthesis of Conductive Polymer Nanotube Structures", Am. Chem. Soc.2007, 129, 14, 4483-4489, Mar. 16, 2007, https://doi.org/10.1021/ja068924v (Year: 2007).*

(Continued)

*Primary Examiner* — William R Alexander
(74) *Attorney, Agent, or Firm* — Sughrue Mion, PLLC

(57) ABSTRACT

Disclosed is a nanowire bundle array. Particularly, the nanowire bundle array according to an embodiment of the present disclosure includes a plurality of nanowire assemblies arranged therein. Each of the nanowire assemblies includes nanowires, a surface of at least a portion of which is coated with a thin metal film and the widths between the nanowires gradually decrease from one end to another end.

13 Claims, 16 Drawing Sheets

(51) Int. Cl.

| | |
|---|---|
| *C25D 11/24* | (2006.01) |
| *C25D 11/10* | (2006.01) |
| *C25D 11/12* | (2006.01) |
| *C25D 11/04* | (2006.01) |
| *F22B 1/00* | (2006.01) |
| *C25D 11/16* | (2006.01) |
| *C23C 14/00* | (2006.01) |
| *C23C 14/18* | (2006.01) |
| *C23C 28/00* | (2006.01) |
| *C25D 1/00* | (2006.01) |
| *C25D 1/08* | (2006.01) |
| *C25D 1/22* | (2006.01) |
| *C25F 3/20* | (2006.01) |
| *D01F 9/08* | (2006.01) |
| *D06M 11/83* | (2006.01) |

(52) U.S. Cl.
CPC .......... *C23C 28/322* (2013.01); *C23C 28/345* (2013.01); *C25D 1/006* (2013.01); *C25D 1/08* (2013.01); *C25D 1/22* (2013.01); *C25D 11/045* (2013.01); *C25D 11/10* (2013.01); *C25D 11/12* (2013.01); *C25D 11/16* (2013.01); *C25D 11/24* (2013.01); *C25F 3/20* (2013.01); *D01F 9/08* (2013.01); *D06M 11/83* (2013.01); *F22B 1/006* (2013.01); *D10B 2101/02* (2013.01); *Y02E 10/44* (2013.01)

(58) Field of Classification Search
CPC ... C23C 14/185; C23C 28/322; C23C 28/345; C25D 1/006; C25D 1/08; C25D 1/22; C25D 11/045; C25D 11/10; C25D 11/12; C25D 11/16; C25D 11/24
USPC .......................................................... 359/885
See application file for complete search history.

(56) References Cited

U.S. PATENT DOCUMENTS

| | | | | |
|---|---|---|---|---|
| 2008/0236652 | A1* | 10/2008 | Defries | .................. H01L 31/04 136/248 |
| 2011/0162870 | A1* | 7/2011 | Markovich | ............. C23C 18/14 174/126.1 |
| 2013/0081693 | A1* | 4/2013 | Kaufman | ................ G02B 5/008 136/257 |
| 2013/0107250 | A1 | 5/2013 | Wu et al. | |
| 2014/0093572 | A1* | 4/2014 | Doktycz | ................ B82Y 30/00 424/489 |
| 2017/0370777 | A1* | 12/2017 | Tanaka | ...................... G01J 1/02 |

OTHER PUBLICATIONS

Communication dated May 19, 2017 from the Korean Intellectual Property Office in corresponding Korean Patent Application No. 10-2015-0162920.

* cited by examiner

NANOWIRE BUNDLE ARRAY, MEMBRANE INCLUDING THE SAME, METHOD OF MANUFACTURING THE MEMBRANE, AND STEAM GENERATOR USING THE MEMBRANE

CROSS-REFERENCE TO RELATED APPLICATION

This application claims priority to and the benefit of Korean Patent Application No. 10-2015-0162920, filed on Nov. 20, 2015, the disclosure of which is incorporated herein by reference in its entirety.

BACKGROUND OF THE INVENTION

1. Field of the Invention

The present disclosure relates to a nanowire bundle array, a membrane including the same, a method of manufacturing the membrane, and a steam generator using the membrane, and more particularly to a nanowire bundle array for efficiently generating steam by converting light from a broad solar spectrum into heat, a membrane including the same, a method of manufacturing the membrane, and a steam generator using the membrane.

2. Description of the Related Art

Solar energy collected to produce steam can be used in many fields including solar energy conversion devices for water purification or sterilization, power plants, and water desalination plants.

By increasing the efficiency of steam generation from sunlight, the performances of systems such as the aforementioned water purification devices, solar power plants, and water desalination plants can be generally increased. As elements that can be considered to efficiently generate steam using sunlight, there are sufficient absorption of solar spectrum, insulation against heat generated by heating water, efficient escape of generated steam bubbles, etc.

Meanwhile, it has been known that, upon localized surface plasmon resonance heating, lights of metal nanoshells or nanoparticles are not reflected and the lights are trapped, whereby heating is carried out.

Conventionally, the geometrical structures of surface plasmons have been suitably designed to increase the efficiency of resonance light absorption. However, one problem of such a surface plasmon resonance heating method is that an absorption band is narrow due to resonance characteristics of surface plasmons.

SUMMARY OF THE INVENTION

Therefore, the present invention has been made in view of the above problems, and it is an object of the present invention to provide a nanowire bundle array for converting light into heat using a maximum solar spectrum area from a visible light area to an infrared light area, a membrane including the same, a method of manufacturing the membrane, and a steam generator including the membrane.

It is another object of the present invention to provide a nanowire bundle array having a high light absorption rate, a low reflection rate, and superior conversion efficiency of solar heat into steam, a membrane including the same, a method of manufacturing the membrane, and a steam generator including the membrane.

In accordance with the present invention, the above and other objects can be accomplished by the provision of a nanowire bundle array, wherein a plurality of nanowire assemblies is arranged in the nanowire bundle array, wherein each of the nanowire assemblies includes a plurality of nanowires, wherein at least a portion of the nanowires is coated with a thin metal film and widths between the nanowires decrease from one ends of the nanowires to another ends of the nanowires.

In addition, a portion of the nanowire assembly may be spaced from another nanowire assembly by a predetermined interval.

In addition, the nanowires may include a nanowire body part made of an alumina material; and a thin metal film including at least one selected from the group consisting of gold, silver, titanium, nickel, aluminum, palladium, platinum, titanium oxide, and titanium nitride.

In addition, each of nanowires included in the nanowire assembly is collapsed in a predetermined direction and supported by neighboring nanowires.

In addition, the nanowire may be bound to any one of the nanowires included in the nanowire assembly by capillary force of a liquid present between the nanowires.

In addition, the nanowires may be bound at one end of the nanowire assembly and spaced from each other at another end of the nanowire assembly.

In addition, an upper part of the nanowire assembly may form an upwardly protruding peak and a dented valley may be formed between any one of the nanowire assemblies and another neighboring nanowire assembly.

In addition, the nanowires included in the nanowire assembly may be made of a flexible material, at least a portion of at least one of the nanowires may be bent, and, in the bent state, the nanowire may be bound to another nanowire.

In addition, the nanowire assembly may be formed into a funnel structure, intervals between the nanowires of the nanowire assembly may be formed into nanoscales, the nanowire assembly may be formed to a microscale height, and width and a plurality of the nanowire assemblies may be disposed in the nanowire bundle array.

In addition, intervals between the nanowires may be less than 500 nm, a height of the nanowire assembly may be 100 nm to 30 μm, and intervals between the nanowire assemblies may be 1 μm to 70 μm.

In addition, light from a visible light area to an infrared light area may be absorbed and thus light appears black and, when light is irradiated, heat is generated by surface plasmon resonance heating.

In addition, the nanowire assemblies may be spaced at a predetermined interval and formed in a vertical direction, and the nanowire assemblies, which locate one side and another side, of the nanowire assembly are collapsed and, accordingly, bind with other nanowire assemblies.

In accordance with another aspect of the present invention, there is provided the present disclosure a nanowire bundle array, including a base substrate; and a plurality of nanowire assemblies arranged on the base substrate, wherein at least a portion of a surface of each of the nanowire assemblies includes a plurality of nanowires coated with a thin metal film, wherein widths between the nanowires decrease from one end to another end.

In addition, when an adhesive substrate may be attached to an upper part of the nanowire assembly, the nanowire assembly may be removable from the base substrate.

In accordance with another aspect of the present invention, there is provided A membrane, including a porous support; and nanowire assemblies, each of which includes a plurality of nanowires and which have a shape wherein widths between the nanowires gradually decrease from one end to another end, wherein a plurality of the nanowire assembly is disposed at microscale, thereby forming a nanowire bundle array, wherein the nanowires are supported by the porous support and at least a portion of the nanowires is coated with a thin metal film.

In addition, the supporter may include microchannels through which a fluid flows and, when light is irradiated to the nanowire bundle array, the fluid transferred to the nanowire bundle array via the microchannels may be heated.

In addition, an adhesive material may be provided on at least one side of the supporter and the nanowires bundle is attached to the supporter by the adhesive material.

In accordance with another aspect of the present invention, there is provided A steam generator, including a body part in which water is contained and one side of which is opened such that outside light is irradiated to the water; and a membrane including a plurality of nanowire assemblies, each of the nanowire assemblies including a plurality of nanowires and the nanowire assemblies being disposed at microscale to form a nanowire bundle array, wherein the nanowires float on water contained in the body part, at least a portion of the nanowires is coated with a thin metal film, and widths between the nanowires are decreased from one end to another end.

In addition, an insulating member may be provided around the body part to prevent heat loss.

In accordance with yet another aspect of the present invention, there is provided a method of manufacturing a membrane, the method including electropolishing a base substrate; anodizing the base substrate to form at least one nanowire on the base substrate; expanding pores of the at least one nanowire; forming a nanowire bundle array including nanowire assemblies having a shape wherein widths are decreased from one end to another end by controlling self-aggregation of the pore-expanded at least one nanowire; depositing a metal on the nanowire bundle array formed on the base substrate; and separating the nanowire bundle array from the base substrate using a porous adhesive mean and thus completing a membrane.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
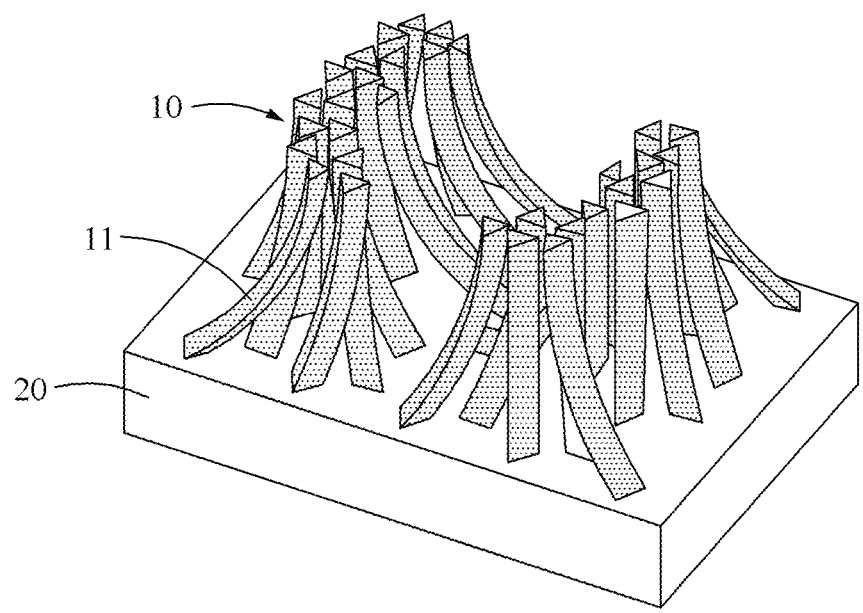
FIG. 1 illustrates a perspective view of a nanowire bundle array according to an embodiment of the present disclosure.

The present invention will now be described more fully with reference to the accompanying drawings, in which exemplary embodiments of the invention are shown. This invention may, however, be embodied in many different forms and should not be construed as limited to the exemplary embodiments set forth herein. Like reference numerals in the drawings denote like elements.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "includes" and/or "including," when used in this specification, specify the presence of stated features, steps, operations, elements, and/or components, but do not preclude the presence or addition of one or more other features, steps, operations, elements, components, and/or groups thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

Further, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Figure 2:
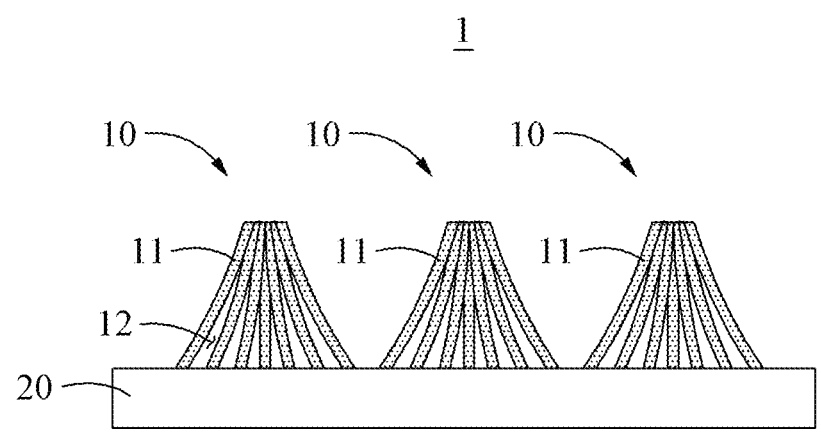
FIG. 2 illustrates a side view of a nanowire bundle array according to an embodiment of the present disclosure.

FIG. 1 illustrates a perspective view of a nanowire bundle array according to an embodiment of the present disclosure, and FIG. 2 illustrates a side view of a nanowire bundle array according to an embodiment of the present disclosure.

Referring to FIGS. 1 and 2, the nanowire bundle array 1 according to an embodiment of the present disclosure may include a base substrate 20 and nanowire assemblies 10 that are disposed on base substrate 20 at a predetermine interval.

The base substrate 20 may have a flat rectangular shape, and the base substrate 20 may support a plurality of the nanowire assemblies 10.

The base substrate 20 may be made of a metal material. For example, the base substrate 20 may be made of aluminum.

Each nanowire assembly 10 may include a plurality of nanowires 11, and the nanowires 11 may be deposited or coated with a thin metal film. The heights of the nanowire assemblies 10 may be 100 nm to 30 µm and an interval between ridges of the nanowire assemblies 10 may be 1 µm to 70 µm. That the nanowire assemblies 10 are "spaced at a predetermined interval" may mean that ridges of the neighboring nanowire assemblies 10 are spaced from each other.

Each of the nanowires 11 may include a nanowire body part 111 and a metal coating part 112 (see FIG. 3).

The nanowire body part 111 is very thinly formed and thus may have a property easily bent by an external force. For example, the nanowire body part 111 may be made of alumina. The nanowire body part 111 may have a diameter of about 10 to 30 nm.

Examples of the metal coating part 112 that may be coated on the nanowire body part 111 include gold (Au), silver (Ag), titanium (Ti), nickel (Ni), aluminum (Al), palladium, platinum (Pt), titanium oxide, titanium nitride, and the like. The metal coating part 112 may be formed to a thickness of about 20 to 100 nm.

The length of each of the nanowires 11 may be 100 nm to 50 µm, the thickness of each of the nanowires 11 may be 10 nm to 70 nm, and an interval between strands of the nanowires 11 may be 500 nm or less.

Each of the nanowires 11 included in the nanowire assemblies 10 may couple with at least a portion of the nanowires 11 included in the nanowire assemblies 10. For example, an upper part of each of the nanowire assemblies 10 may be formed by a plurality of the nanowires 11, upper parts of which are aggregated, as illustrated in FIGS. 1 and 2. In addition, a lower part of each of the nanowire assemblies 10 may include a plurality of the nanowires 11, lower parts of which are spaced from each other. The lower parts of the nanowire assemblies 10 may be fixed onto the base substrate 20. A process of forming the nanowire assemblies 10 on the base substrate 20 is described below.

The nanowires 11 of the nanowire assemblies 10 may be bound to each other due to the capillary force of a liquid between one of the nanowires 11 and another one of the nanowires 11.

The nanowires 11 included in the nanowire assemblies 10 may be made of a flexible material, and, when the nanowires 11 bind to each other, at least portions of the nanowires 11 may be bound to each other in a bent state.

The nanowire assemblies 10 may be formed in a shape wherein an entire width of each of the nanowire assemblies 10 decreases from a lower part thereof to an upper part thereof. In other words, upper parts of the nanowire assemblies 10 may be overall formed in an acuate shape, and lower parts thereof may be formed in a widely spreading shape. Sides of the nanowire assemblies 10 may be slantingly formed (into a tapered shape), and tilt angles of sides of the nanowire assemblies 10 may be less than 1°. In other words, the nanowire assemblies 10 may be formed into a funnel structure.

At an upper part of each of the nanowire assemblies 10, an upwardly protruding peak may be formed. In addition, between any one of the nanowire assemblies 10 and the neighboring nanowire assemblies 10, dented valleys may be formed.

In addition, each of the nanowires 11 included in the nanowire assemblies 10 may be manufactured to a thin thickness to be slanted in a predetermined direction and be supported by the neighboring nanowires 11.

Between the nanowires 11 included in the nanowire assemblies 10, a very small interval 12 having a size of tens of nanometers may be formed.

The interval 12 between the nanowires 11 included in the nanowire assemblies 10 may be measured in nanometers. In other words, the interval 12 between the nanowires 11 may be called a nanogap. Due to such a nanogap, nanofocusing by surface plasmon may be induced. Accordingly, broadband absorption reaching 91% on average over a wavelength range of 400 nm to 2.5 μm may be accomplished.

In addition, the nanowire assemblies 10 are formed to a microscale height, and a plurality of the nanowire assemblies 10 may be disposed in a microscale width. The nanowire assemblies 10 are aggregated and thus exhibit a ridge-valley structure having intervals of 3 μm to 10 μm (see FIGS. 3D and 4B). Due to such a structure, the nanowire assemblies 10 can absorb light even in an infrared band and absorption performance thereof reaches 93% up to a wavelength of 17 μm in a measurable range.

Figure 3A:
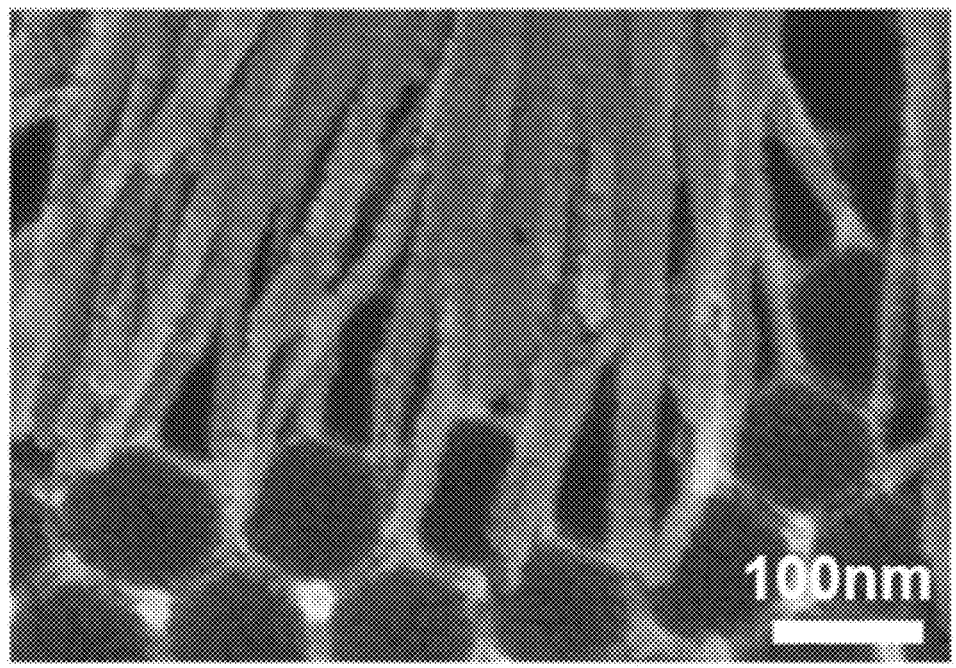
FIG. 3A is an SEM image illustrating that, when nanowires of a nanowire bundle array according to an embodiment of the present disclosure are collapsed due to capillary force, the nanowires are bound to honeycomb-shaped hexagonal vertices of a base substrate.
Figure 3B:
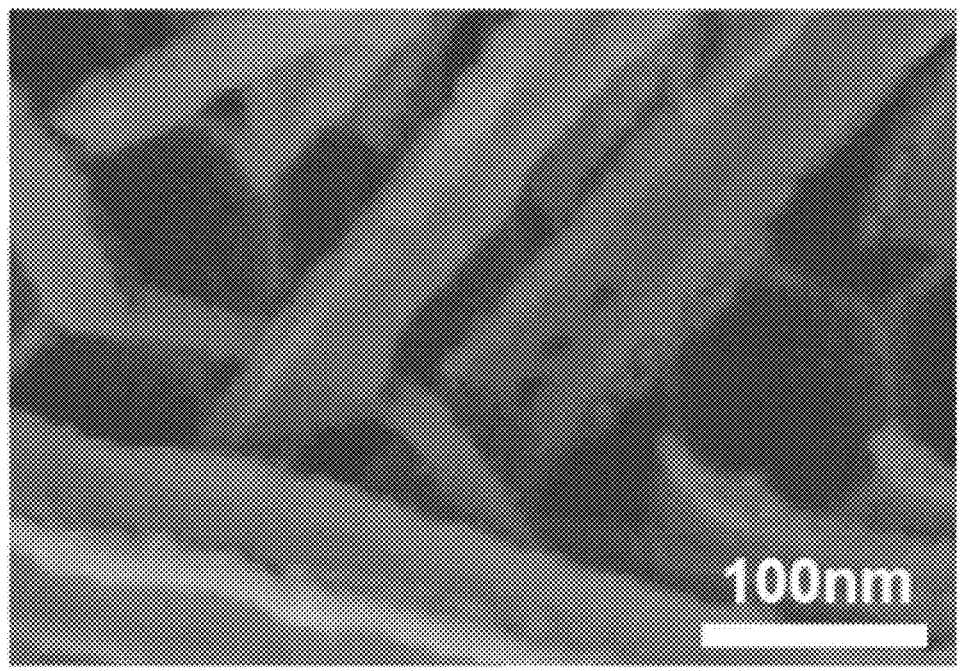
FIG. 3B is an SEM image illustrating nanowires coated with a thin metal film.
Figure 3C:
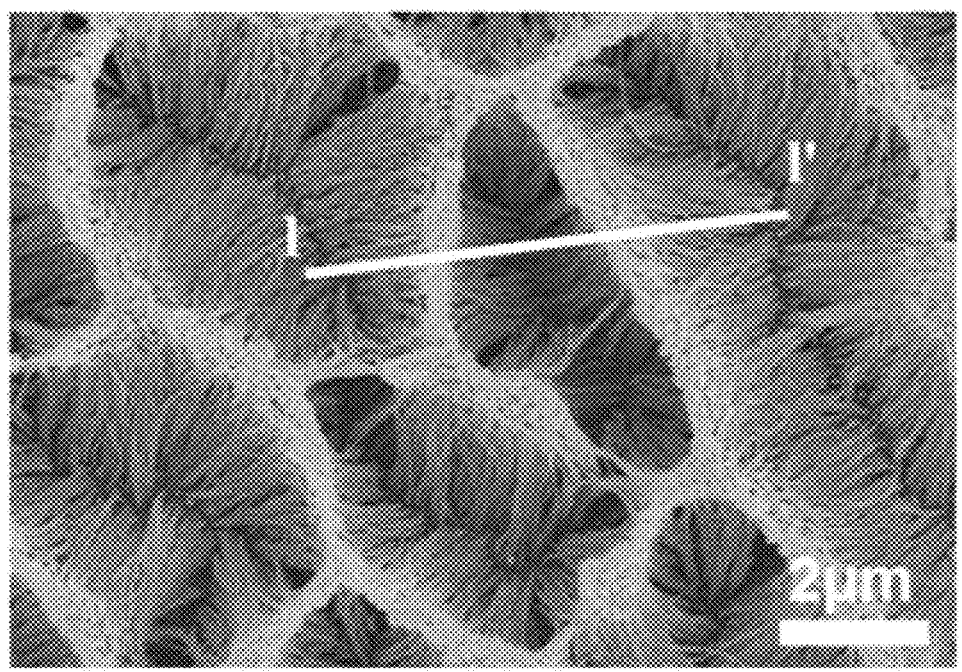
FIG. 3C is an SEM image illustrating upper parts of the collapsed nanowires are bonded to each other and thus are formed in a ridge-like shape.
Figure 3D:
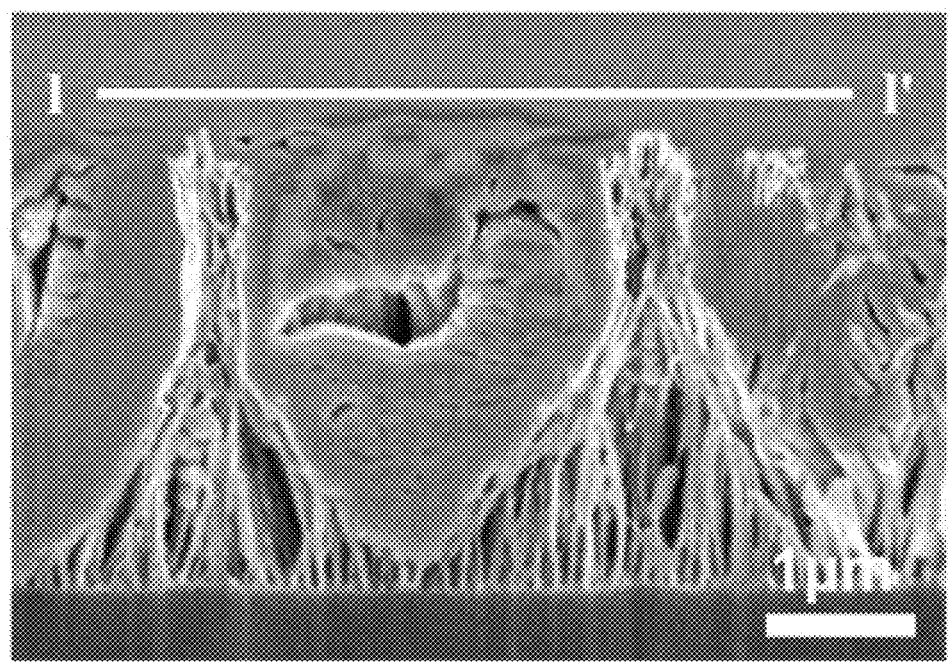
FIG. 3D illustrates a sectional view of FIG. 3C taken along line I-I'.
Figure 4A:
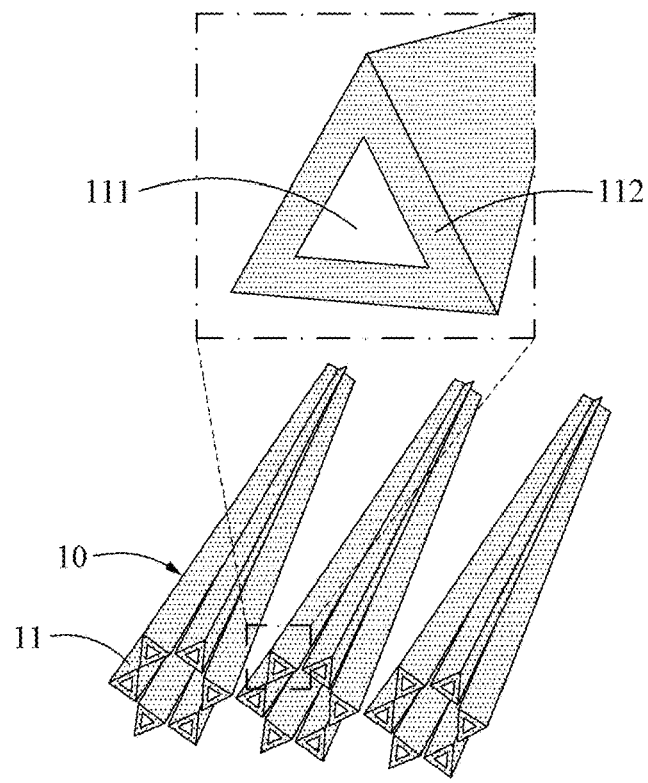
FIG. 4A illustrates that a lower part of each of nanowires of a nanowire bundle array according to an embodiment of the present disclosure is disposed in a hexagonal shape and upper parts of the nanowires are combined.
Figure 4B:
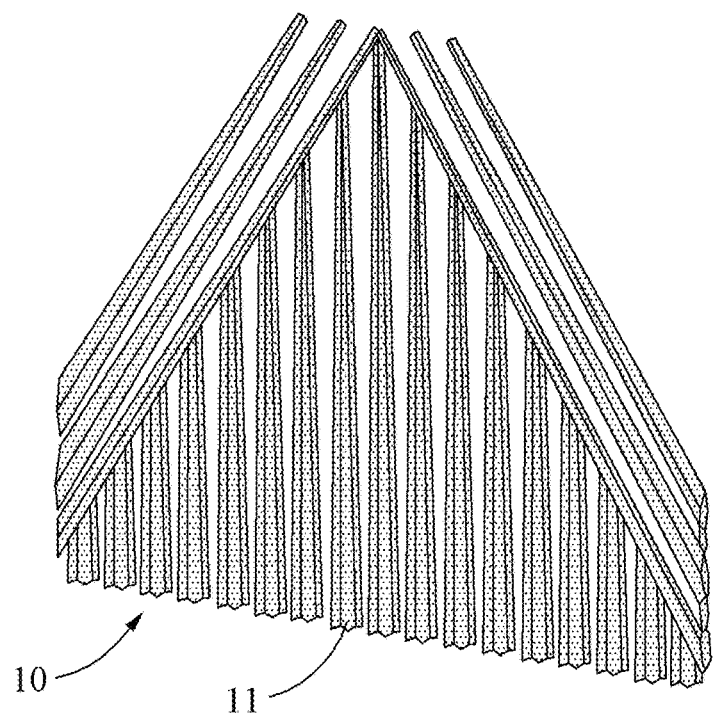
FIG. 4B illustrates a funnel-shaped nanowire bundle array that is modeled by arranging nanowire assemblies according to an embodiment of the present disclosure in a vertical direction or slantingly.
Figure 5A:
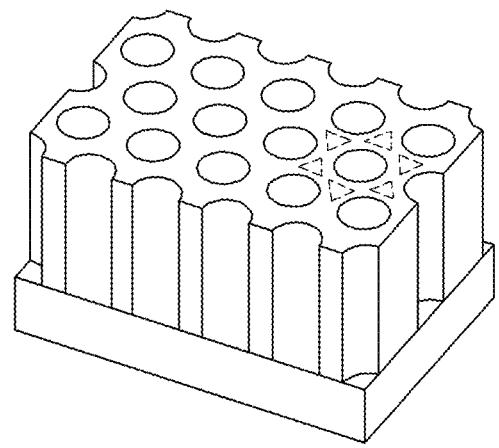
FIGS. 5A-5F sequentially illustrate a process of manufacturing a membrane according to an embodiment of the present disclosure.
Figure 5B:
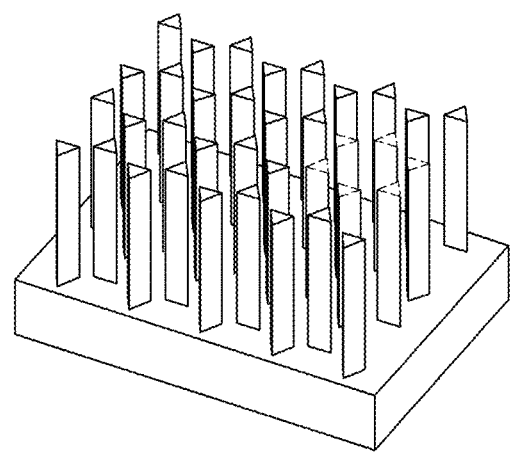
Figure 5C:
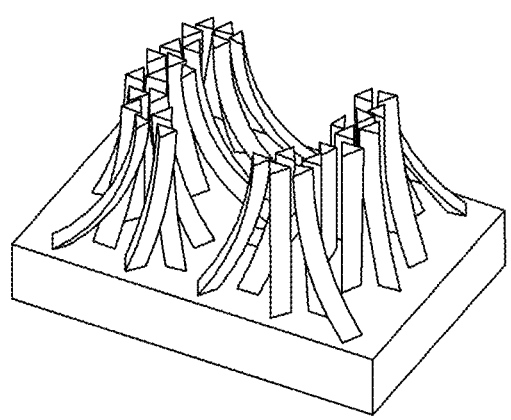
Figure 5D:
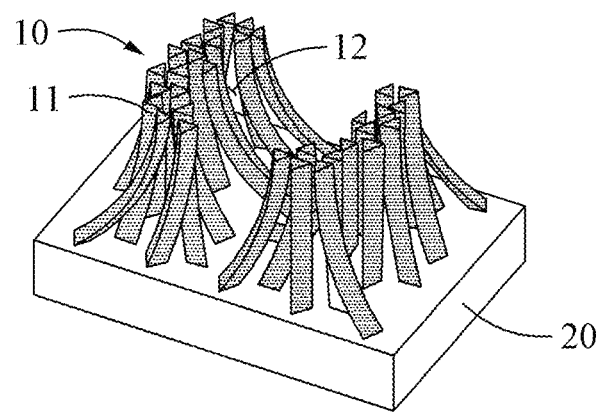
Figure 5E:
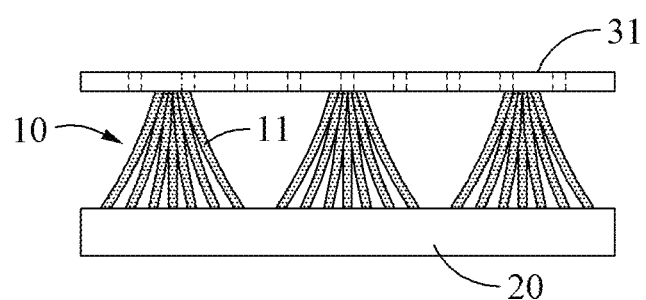
Figure 5F:
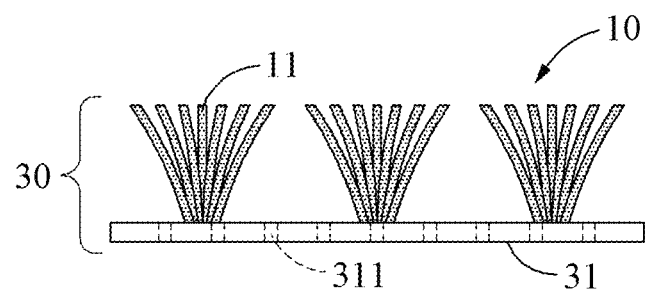

As such, when the plurality of nanowire assemblies 10 is formed into a microscale nanowire bundle array 1 as illustrated in FIG. 3D or 4B, broad-wavelength-range light from visible light to infrared light may be absorbed, as compared to a single nanowire assembly 10. Such absorbed light may be converted into heat.

In addition, when both sides of the nanowire assemblies 10 of the nanowire bundle array 1 are inwardly collapsed, broader-wavelength-range light (infrared light area) can be absorbed compared to the case of the use of a single nanowire assembly 10. This occurs because, in the single nanowire assembly 10, only minute nanogaps, i.e., the intervals 12 between the nanowires 11 are present, whereas, when the nanowire assemblies 10 are congregated to from the nanowire bundle array 1 and both sides of the nanowire assemblies 10 are inwardly collapsed as illustrated in FIG. 3D or 4B, various gaps from nanoscale gaps to microscale gaps are present.

FIG. 3A is an SEM image illustrating that, when nanowires of a nanowire bundle array according to an embodiment of the present disclosure are collapsed due to capillary force, the nanowires are bound to honeycomb-shaped hexagonal vertices of a base substrate, FIG. 3B is an SEM image illustrating nanowires coated with a thin metal film, and FIG. 3C is an SEM image illustrating upper parts of the collapsed nanowires are bonded to each other and thus are formed in a ridge-like shape, and FIG. 3D illustrates a sectional view of FIG. 3C taken along line I-I'.

Referring to FIGS. 3A and 3B, it can be confirmed that, even when the nanowires 11 are collapsed by capillary force, the nanowires 11 are bound to honeycomb-shaped hexagonal vertices formed in the base substrate 20 in an anodizing process. The sizes of the hexagons are about 58 nm.

In addition, it can be confirmed that the nanowire body part 111 made of alumina is formed into a triangular shape, the length of a side at a cross section of which is 26 nm.

In addition, the metal coating part 112 may be coated to a thickness of 40 nm on the nanowire body part 111. The length of a side of such a metal-coated nanowire 11 may be 40 nm.

Referring to FIG. 3C, the metal-coated nanowire assemblies 10 are bound to each other and thus may have patterns similar to a ridge and a valley.

Referring to FIG. 3D, the cross section of the nanowire bundle array 1 formed by gathering of the nanowire assemblies 10 bonded to each other, as well as the nanowire assemblies 10, may have a funnel structure, i.e., a concave funnel structure, and may be formed to a height of 2.4 μm and a width of 2.9 μm, i.e., a microscale, and at a side angle of 33°.

More particularly, the nanowire assemblies 10 disposed inside are extended in an almost vertical direction. In addition, the nanowire assemblies 10 at left and right sides of the nanowire bundle array 1 are inwardly collapsed and thus may form a funnel structure. In other words, the nanowire assemblies 10 at left and right sides of the nanowire bundle array 1 are inwardly, slantingly disposed.

As such, when the nanowire assemblies 10 are bound and thus a multiscale structure is formed, various nanoscale nanogaps (0 to 200 nm) are present. Accordingly, absorption of a broader wavelength range can be accomplished, compared to the single nanowire assembly 10.

In other words, in the case of the multiscale structure that is formed by bonding of the nanowire assemblies 10, several micron depths and zero to several hundred nanometer nanoscale gaps in 3 μm funnel structures are formed (see FIG. 4B), and thus, absorption of a broader wavelength range can be accomplished compared to the single nanowire assembly 100.

FIG. 4A illustrates that a lower part of each nanowire of a nanowire bundle array according to an embodiment of the present disclosure is disposed in a hexagonal shape and upper parts of the nanowires are combined, and FIG. 4B illustrates a funnel-shaped nanowire bundle array that is modeled by arranging nanowire assemblies according to an embodiment of the present disclosure in a vertical direction or at an angle.

FIG. 4A schematically illustrates that the nanowire assemblies 10 of the present disclosure are arranged side by side, and FIG. 4B schematically illustrates that the nanowire assemblies 10, which are bound to each other, of FIG. 3D, form a funnel structure, i.e., a concave funnel structure.

Figure 6:
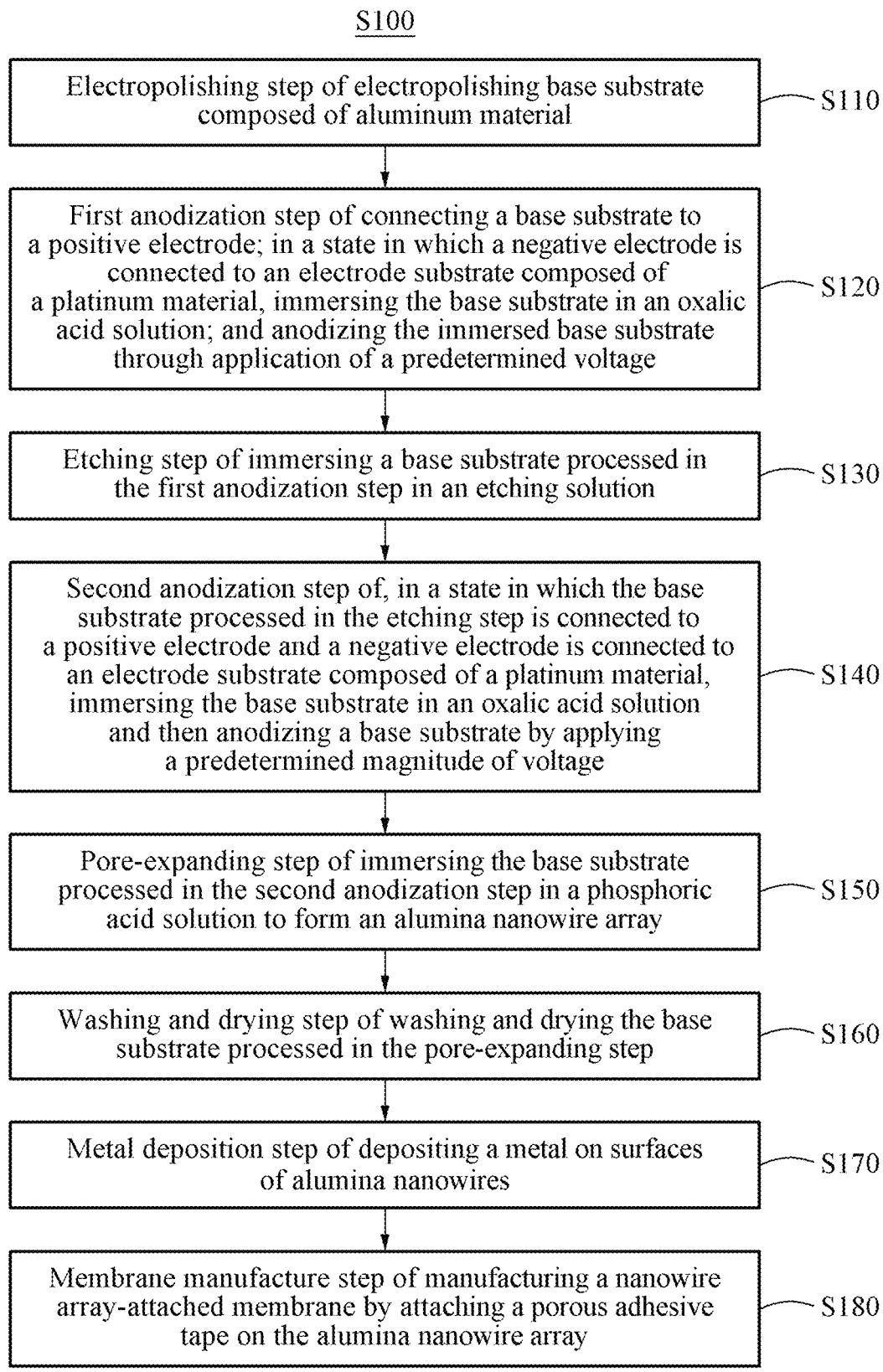
FIG. 6 illustrates a flowchart of a procedure of manufacturing a membrane according to an embodiment of the present disclosure.

FIGS. 5A-5F sequentially illustrate a process of manufacturing a membrane according to an embodiment of the present disclosure, and FIG. 6 illustrates a flowchart of a procedure of manufacturing a membrane according to an embodiment of the present disclosure.

A method of manufacturing a membrane (S100) according to the present disclosure may include an electropolishing step (S110), a first anodizing step (S120), an etching step (S130), a second anodizing step (S140), a pore-expanding step (S150), a washing and drying step (S160), the metal deposition step (S170), and a membrane completion step (S180).

In particular, in the electropolishing step (S110), the base substrate 20 composed of an aluminum material is electropolished. The electropolishing step (S110) may further include a surface treatment step (S115) in which a base substrate is surface-treated using a mixture of a perchloric acid and ethanol.

The electropolishing step (S110) may be performed by applying a voltage of 15 V to 25 V in a state in which the base substrate 20 is immersed in a mixture solution of perchloric acid and ethanol.

In the first anodizing step (S120), the base substrate 20, which is connected to a positive electrode, and an electrode substrate composed of a platinum material, which is connected to a negative electrode, are immersed in an oxalic acid solution and then a predetermined voltage is applied thereto, thereby anodizing the base substrate 20.

On a surface of the base substrate 20 processed in the first anodizing step (S120), an anodic aluminum oxide (AAO), which has nanoholes having intervals of 90 nm to 110 nm in a honeycomb-like shape (hexagonal array), may be formed.

In the etching step (S130), the base substrate 20 processed in the first anodizing step (S120) is immersed in an etching solution, thereby performing etching.

In particular, the etching step (S130) may include an etching solution preparation step (S131) of preparing a mixture 30 of chromic acid and phosphoric acid and a base substrate etching step (S132) of immersing the base substrate 20 in an etching solution.

Anodic aluminum oxide (AAO) is removed from a surface of the base substrate 20 processed in the etching step (S130). Accordingly, honeycomb-shaped concave grooves merely remain at a uniform interval.

In the second anodizing step (S140), the base substrate 20 processed in the etching step (S130) is connected to a positive electrode and an electrode substrate composed of a platinum material is connected to a negative electrode and, in this state, the electrode substrate 20 and the electrode substrate are immersed in an oxalic acid solution, followed by anodizing the base substrate 20 through application of a predetermined magnitude of voltage.

In the pore-expanding step (S150) which is a process of uniformly extending the sizes of pores, the base substrate 20 processed in the second anodizing step (S140) is immersed in a phosphoric acid solution 50, thereby forming an array of the alumina nanowires 11. In particular, the aforementioned phosphoric acid solution is preferably a 5 wt % phosphoric acid solution.

In the washing and drying step (S160), the base substrate 20 processed in the pore-expanding step (S150) is washed and dried. Here, a washing solution used in the washing process may be any one selected from the group consisting of water, ethanol, methanol, isopropanol, and supercritical fluids.

In particular, the alumina nanowires 11 of the base substrate 20 processed in the pore-expanding step (S150) may self-aggregate due to capillary force of a liquid between the alumina nanowires 11 in the washing and drying step. When ethanol, methanol, or isopropanol is used instead of water as a washing solution used in the washing step, aggregation force is changed due to different capillary force thereof. As a result, the array structure of the alumina nanowires 11 may be changed and a plurality of the nanowire assemblies 10 formed of the alumina nanowires 11 bonded to each other may be formed. In other words, the nanowire bundle array 1 may be formed.

The alumina nanowire assemblies 10 formed through the washing and drying step (S160) may be coated with a thin metal film, such as gold (Au), via sputtering.

A porous adhesive substrate 31 is attached to the formed alumina nanowire assemblies 10, thereby manufacturing a membrane 30 to which the array of the alumina nanowire assemblies 10 is attached. The porous adhesive substrate 31 may include microchannels 311 through which a liquid flows.

In particular, the porous adhesive substrate 31 may be a porous adhesive tape. After attaching the porous adhesive substrate 31 to the array of the alumina nanowire assemblies 10, the porous adhesive substrate 31 is tweaked, thereby separating the alumina nanowire assemblies 10 from the base substrate 20.

Figure 7A:
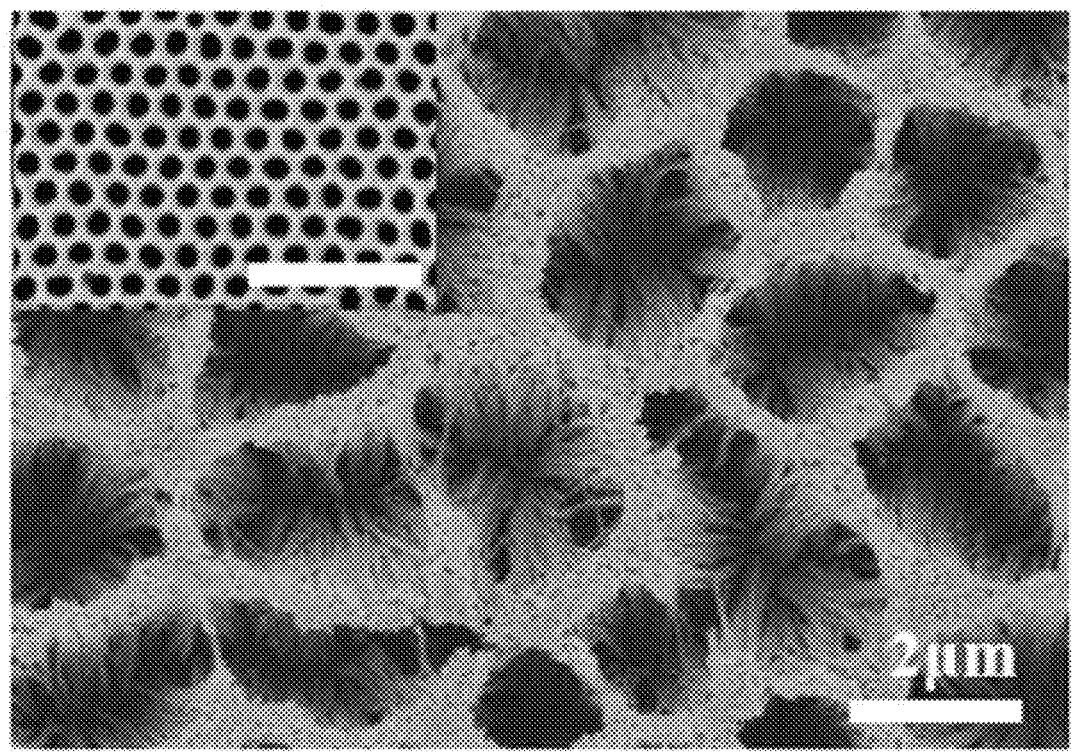
FIG. 7A is an SEM image illustrating the shape of a nanowire bundle array according to an embodiment of the present disclosure viewed from above.
Figure 7B:
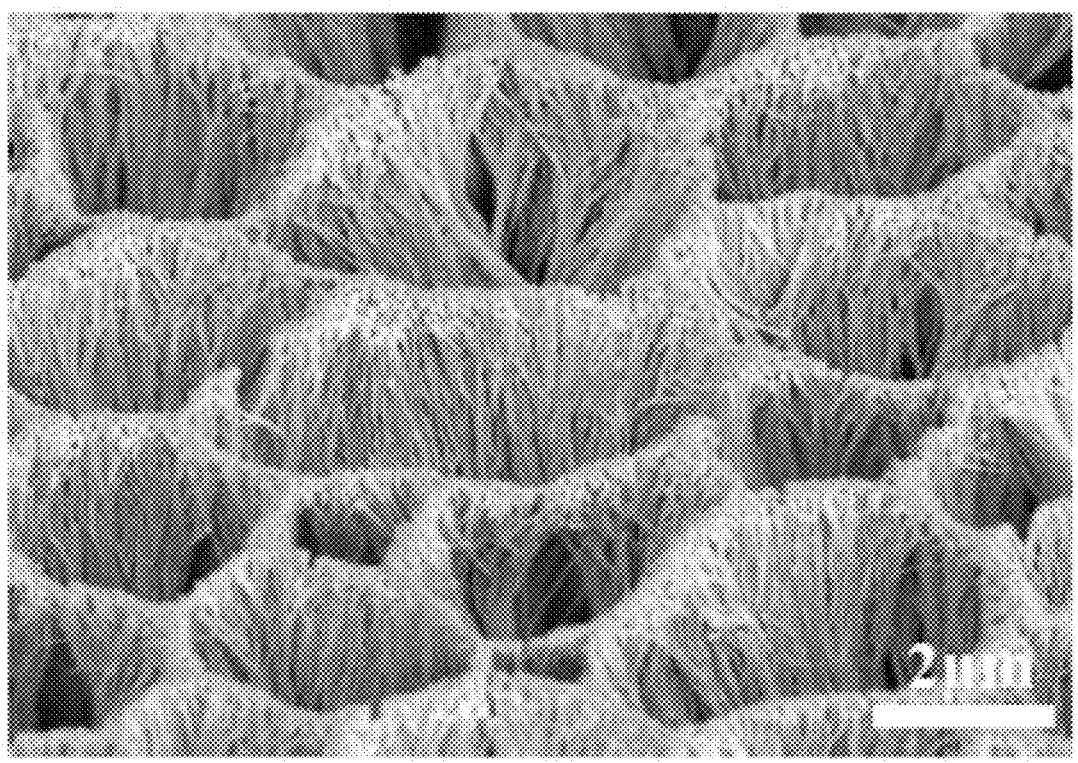
FIG. 7B is an SEM image illustrating a nanowire bundle array according to an embodiment of the present disclosure obliquely viewed.
Figure 7C:
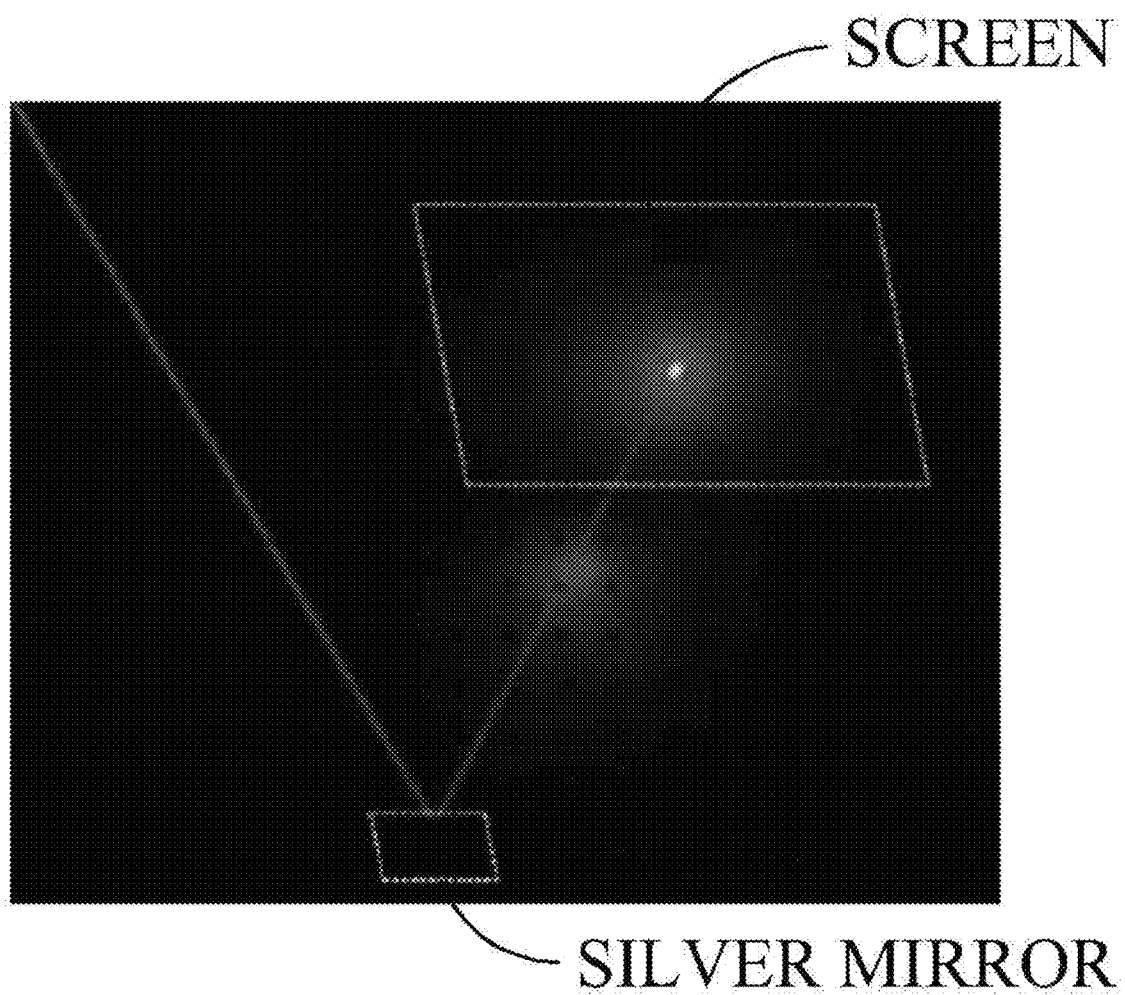
FIG. 7C illustrates an optical photograph of a laser beam reflected by a silver mirror.
Figure 7D:
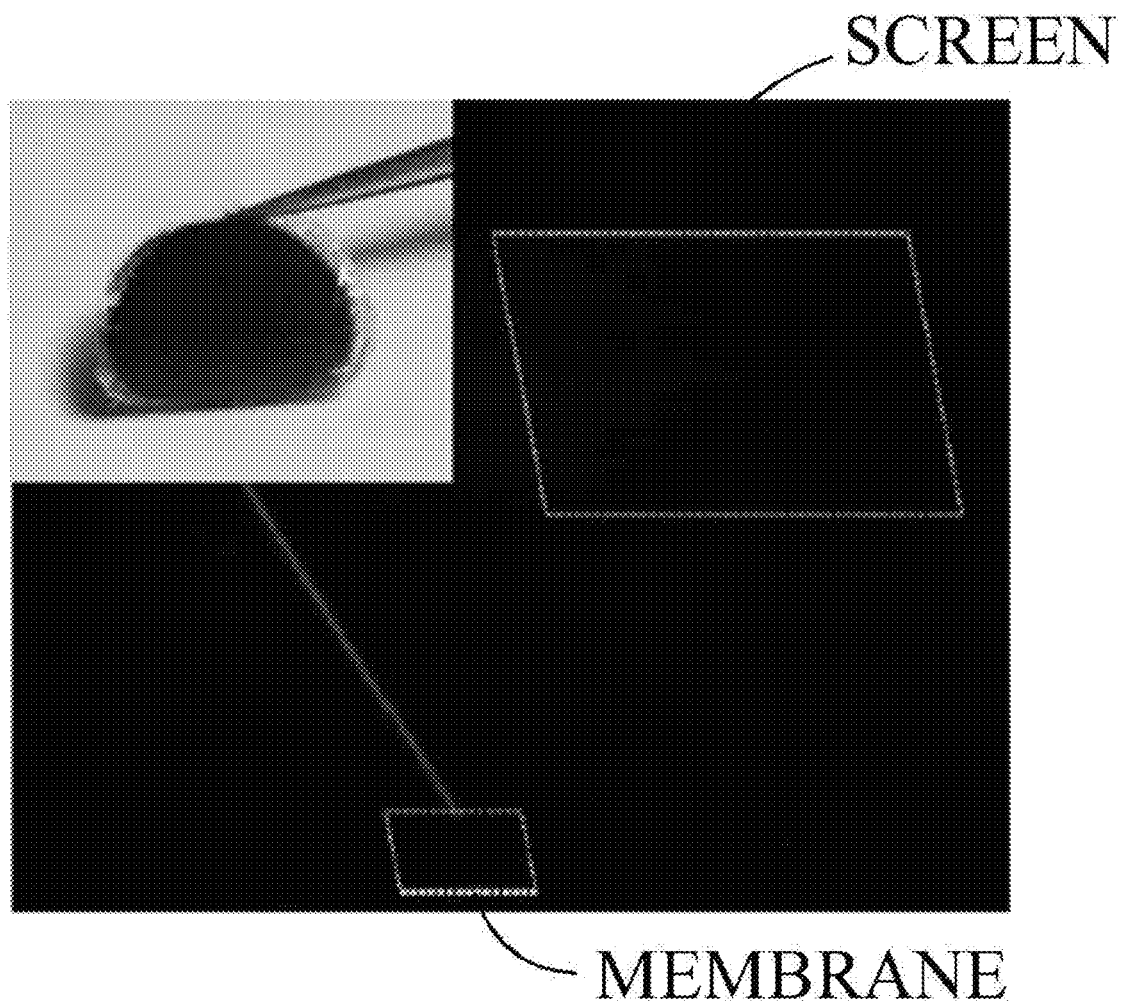
FIG. 7D illustrates an optical photograph of a laser beam reflected by a membrane according to an embodiment of the present disclosure.
Figure 8:
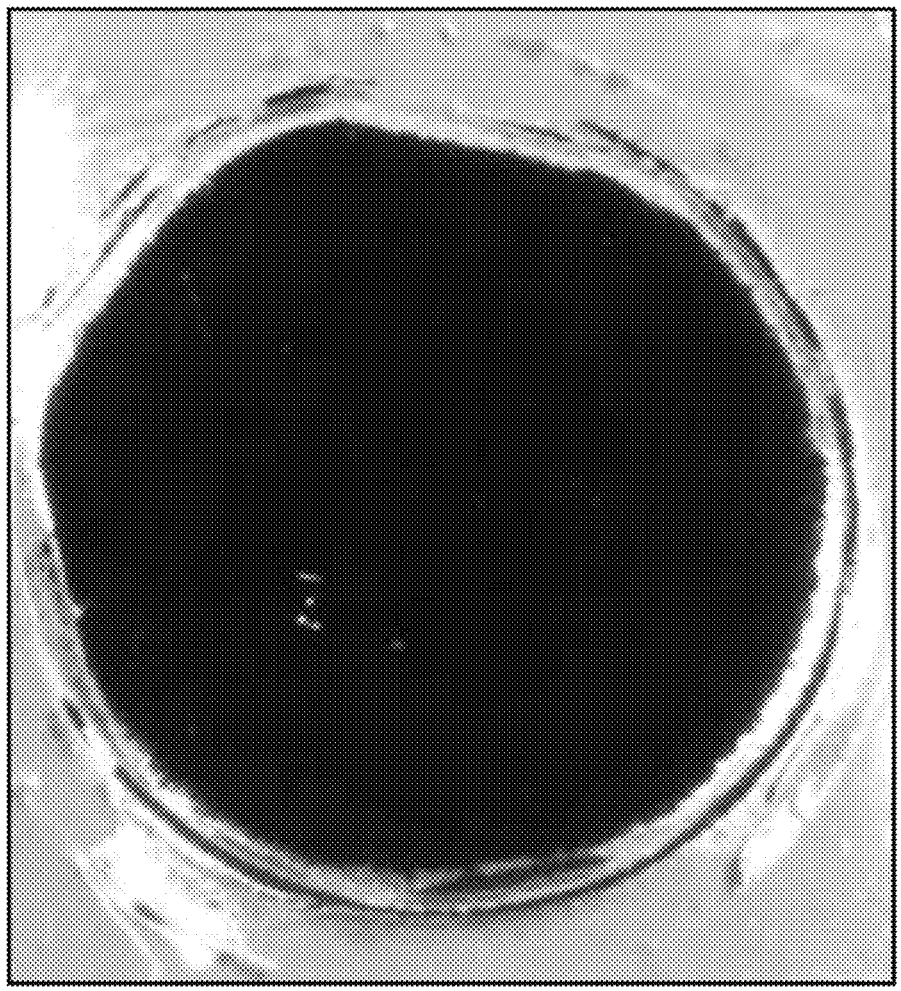
FIG. 8 illustrates a plan view of a membrane according to an embodiment of the present disclosure viewed from above.

FIG. 7A is an SEM image illustrating the shape of a nanowire bundle array according to an embodiment of the present disclosure viewed from above, FIG. 7B is an SEM image illustrating a nanowire bundle array according to an embodiment of the present disclosure obliquely viewed, FIG. 7C illustrates an optical photograph of a laser beam reflected by a silver mirror, and FIG. 7D illustrates an optical photograph of a laser beam reflected by a membrane according to an embodiment of the present disclosure. FIG. 8 illustrates a plan view of a membrane according to an embodiment of the present disclosure viewed from above.

Referring to FIGS. 7A and 7B, since surface tension between the nanowires 11 is randomly oriented, a 3D pattern of the self-binding nanowire bundle array 1 may be similar to a ridge and valley shape.

Referring to FIGS. 7C, 7D, and 8, when a metal, such as gold, is deposited on the nanowire bundle array 1, the nanowire bundle array 1 appears black because, when light is irradiated to the nanowire assemblies 10, most visible light is absorbed. In other words, most visible light may be absorbed by the slant structure of the nanowire assemblies 10 formed through aggregation of the nanowires 11 and the minute intervals 12 formed in the nanowire assemblies 10, i.e., nanogaps.

FIG. 7D illustrates an adhesive substrate attached to the nanowire bundle array 1 according to the present disclosure, i.e., a membrane, the adhesive substrate being irradiated with a laser having a wavelength of 633 nm. Through FIG. 7D, it can be confirmed that light is completely absorbed in the membrane of the present disclosure and thus barely any light is reflected, whereby an image is not formed on a screen. On the other hand, FIG. 7C illustrates that the same laser having a wavelength of 633 nm is irradiated onto a common silver mirror. In this case, it can be confirmed that most light is reflected and thus an image is formed on a screen.

Therefore, it can be confirmed that the membrane 30 including the nanowire bundle array 1 according to the present disclosure has a superior light absorption property.

Figure 9A:
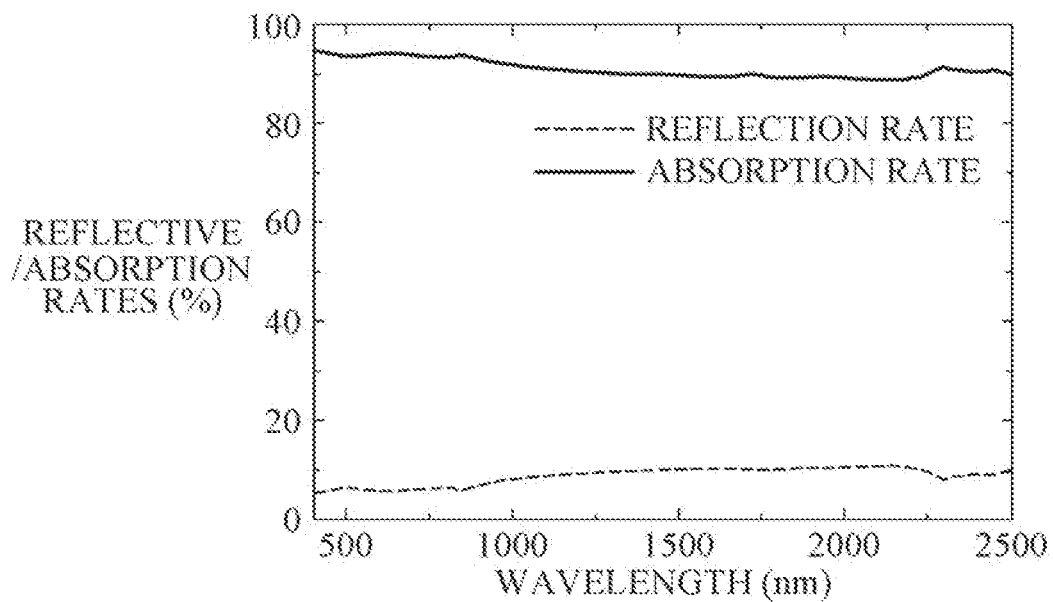
FIG. 9A is a graph illustrating the reflection and absorption rates of a membrane according to an embodiment of the present disclosure in a wavelength range of 400 to 2500 nm.
Figure 9B:
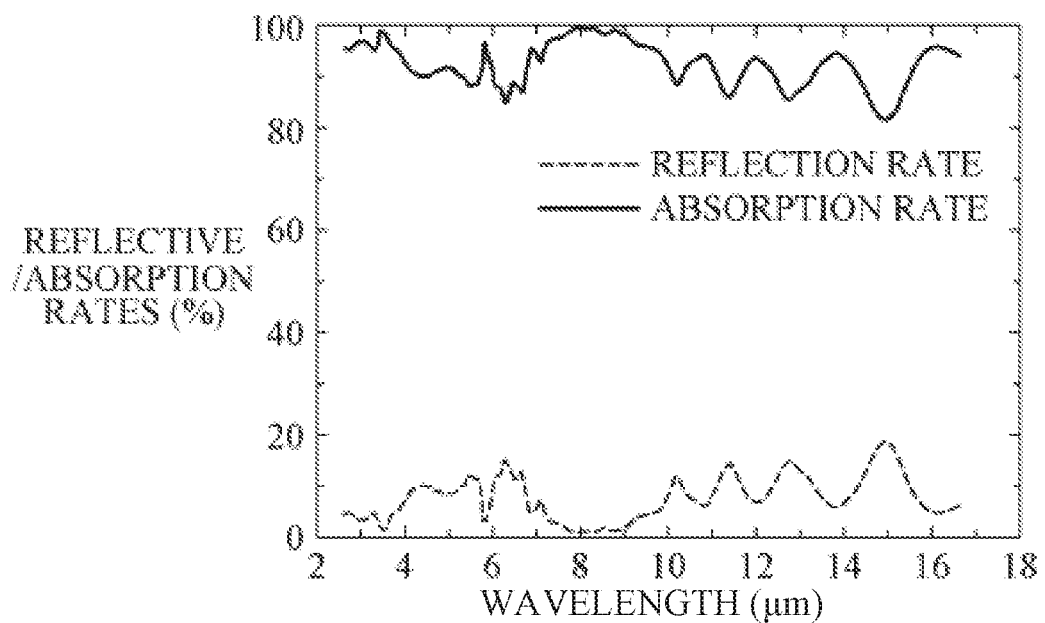
FIG. 9B is a graph illustrating the reflection and absorption rates of a membrane according to an embodiment of the present disclosure measured in an infrared light area of 2.5 µm to 17 µm.

FIG. 9A is a graph illustrating the reflective and absorption rates of a membrane according to an embodiment of the present disclosure in a wavelength range of 400 to 2500 nm, and FIG. 9B is a graph illustrating the reflective and absorption rates of a membrane according to an embodiment of the present disclosure measured in an infrared light band of 2.5 μm to 17 μm.

Referring to FIG. 9A, when light is irradiated to the membrane including the nanowire bundle array 1 according to the present disclosure which is disposed on aluminum tape, a total of the reflection rate is less than 10% in a wavelength range of 400 nm to 2500 nm.

In addition, under the same condition, a total average absorption rate is as high as 91% in a broad range of 400 nm to 2500 nm.

Further, under the same condition, an average reflection rate is observed to be less than 7% at wavelengths below 17 μm.

Based on these experimental results, it can be confirmed that the nanowire bundle array 1 of the present disclosure has superior ultra-broadband absorptivity.

Figure 10A:
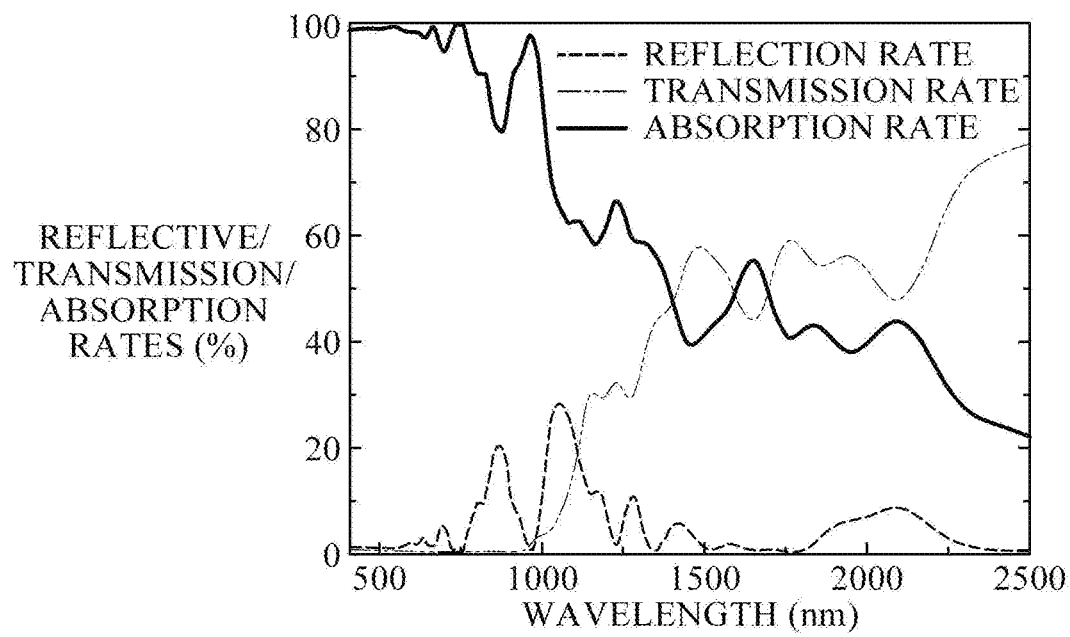
FIG. 10A illustrates graphs of absorption, transmission, and reflection rates measured using a single nanowire assembly formed by disposing nanowires in a hexagonal shape and bonding the same, as illustrated in FIG. 3A.
Figure 10B:
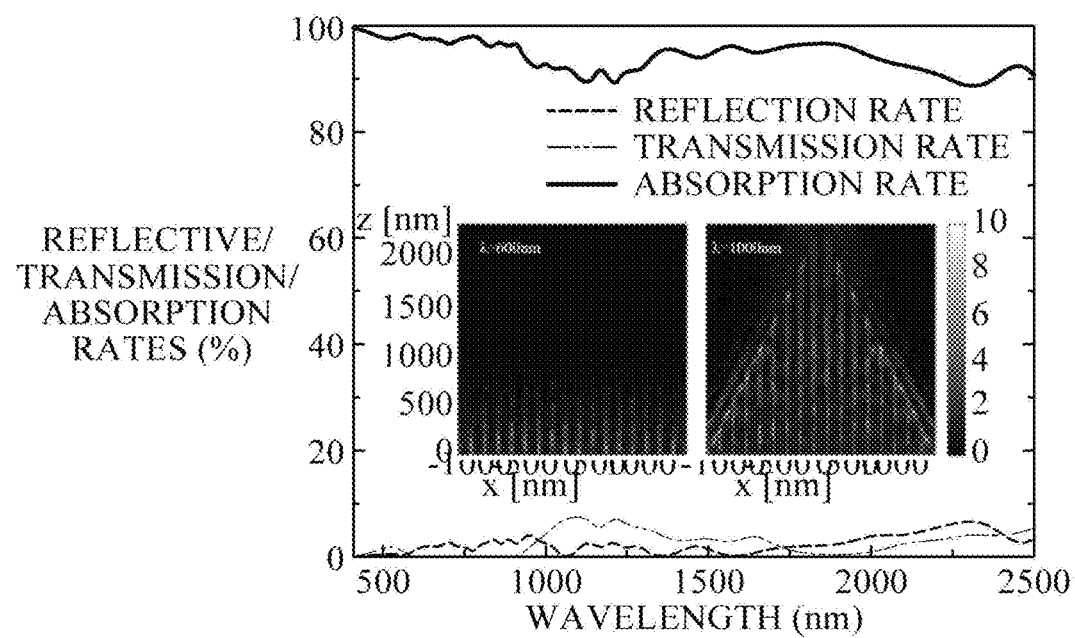
FIG. 10B illustrates graphs of absorption, transmission, and reflection rates measured using a funnel-shaped nanowire bundle array modeled by arranging nanowire assemblies in a vertical direction or at an angle, as illustrated in FIG. 3B.

FIG. 10A illustrates graphs of absorption, transmission, and reflection rates measured using a single nanowire bundle formed by disposing nanowires in a hexagonal shape and bonding the same, as illustrated in FIG. 3A, and FIG. 10B illustrates graphs of absorption, transmission, and reflection rates measured using a funnel-shaped nanowire bundle array modeled by arranging nanowire assemblies in a vertical direction or at an angle, as illustrated in FIG. 3B.

Referring to FIG. 10A, it can be confirmed that, in the case of the single nanowire assembly 10, an absorption rate is high in a wavelength range of 400 nm to 1000 nm, but an absorption rate is rapidly decreased in a wavelength range of greater than 1000 nm.

These results occur because, in the single nanowire assembly 10, intervals between the nanowires 11 are formed in range of 0 nm to 11 nm in a length direction of the nanowires 11, whereas, in the structure of the present invention wherein the nanowire assemblies 10 are collapsed and thus form the nanowire bundle array 1 (see funnel shapes of FIGS. 3D and 4B), the sizes of hexagonal bottoms of the nanowire assemblies 10 are 152 nm and thus various-size distances between nanogaps are present due to various tilt angles between the nanowire assemblies 10.

With regard to plasmon resonance nanofocusing, a wide wavelength band occurs in a wide nanogap and a narrow wavelength band occurs in a narrow nanogap. Accordingly, since the maximum diameter of the single nanowire assembly 10 is 150 nm, nanofocusing resonance occurs in a range of less than 1 μm, but is inefficiently exhibited in a wavelength range of greater than 1 μm.

On the other hand, it can be confirmed that, referring to FIG. 10B, the nanowire bundle array 1 in which a plurality of the self-binding funnel-shape nanowire assemblies 10 are arranged and bound to each other (see FIG. 4B) exhibits effective absorption up to a wavelength of 2500 nm. In the structure illustrated in FIG. 4B, intervals between the nanowire assemblies 10 standing side by side in a vertical direction are about 173 nm, and such intervals between the nanowire assemblies 10 allow to form nanogaps in a broader range. As a result, even near-infrared light can be absorbed.

In addition, the general funnel structure illustrated in FIG. 4B has a width of 2.9 μm and functions like a metal microcone structure, thereby absorbing a broadband range of about 17 μm.

In addition, photographs inserted in a graph of FIG. 10B show electric field distribution at wavelengths of 600 nm and 1000 nm. From the photographs, it can be confirmed that, in the case of the shorter wavelength, light is absorbed by the nanowire assemblies 10 and, in the case of the broad wavelength, light is absorbed in a funnel shape, i.e., the entirety of the funnel shape.

Figure 11:
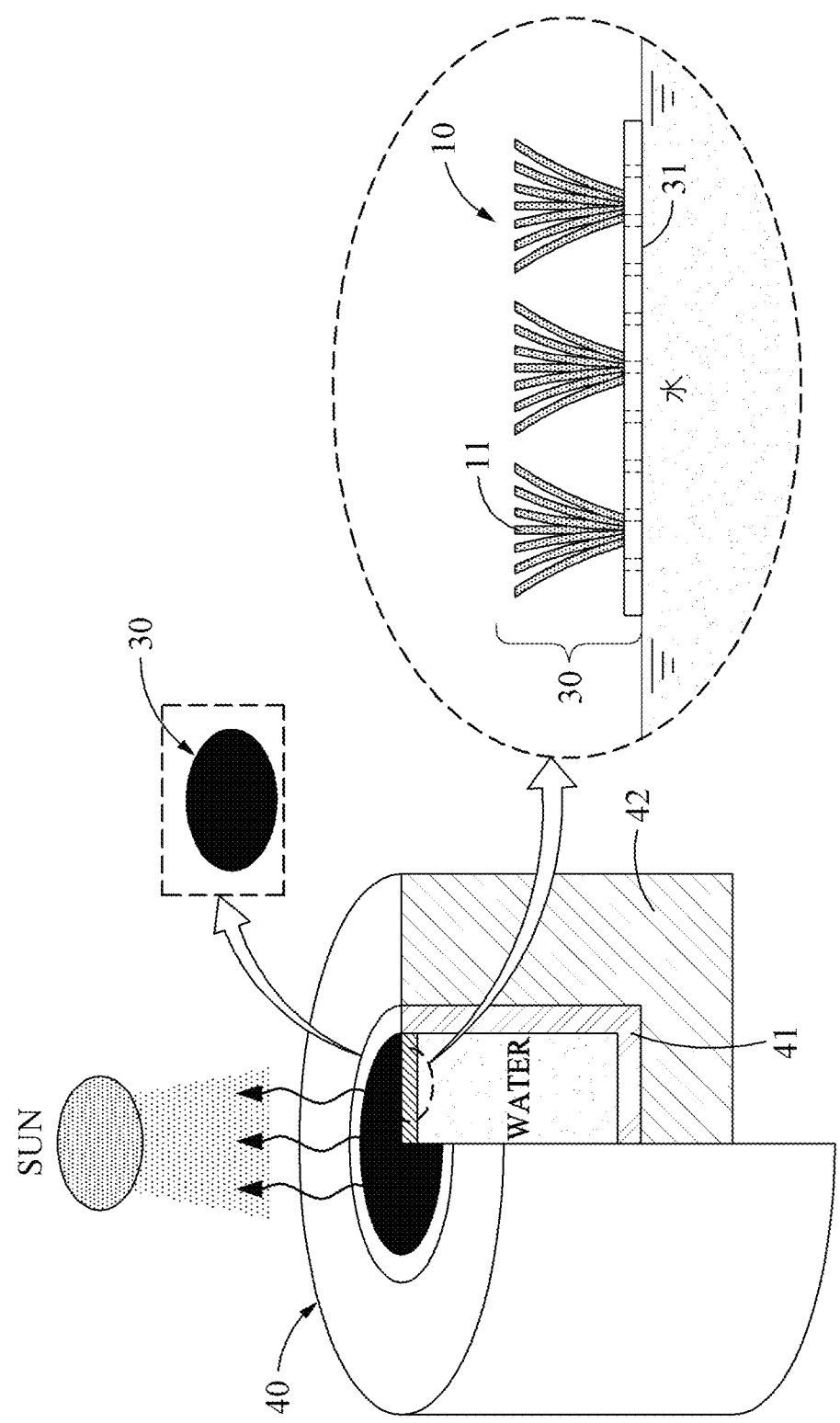
FIG. 11 schematically illustrates the structures of a steam generator and a membrane according to an embodiment of the present disclosure.
Figure 12A:
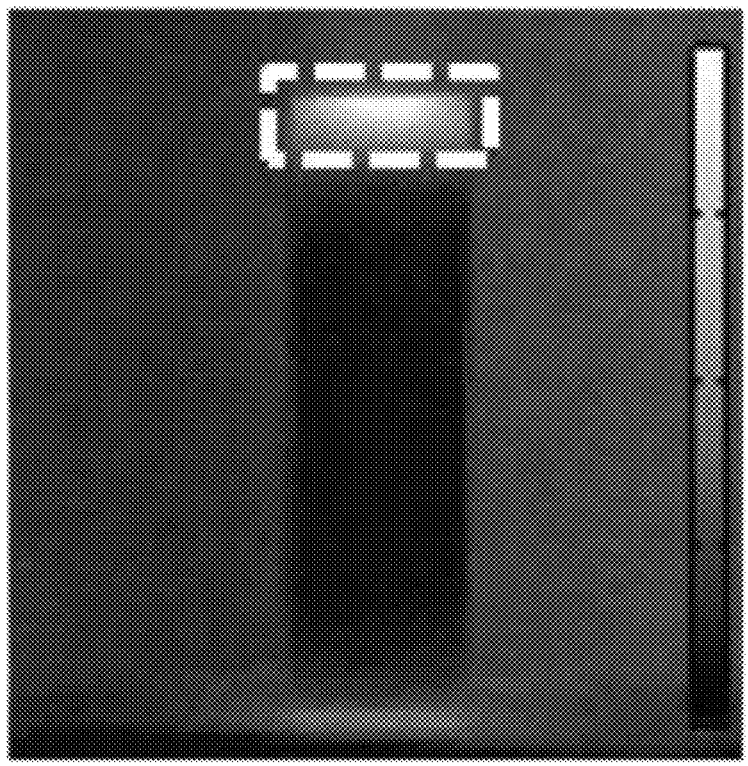
FIG. 12A illustrates an infrared image of a membrane according to an embodiment of the present disclosure which floats on water contained in a steam generator and is irradiated with light.
Figure 12B:
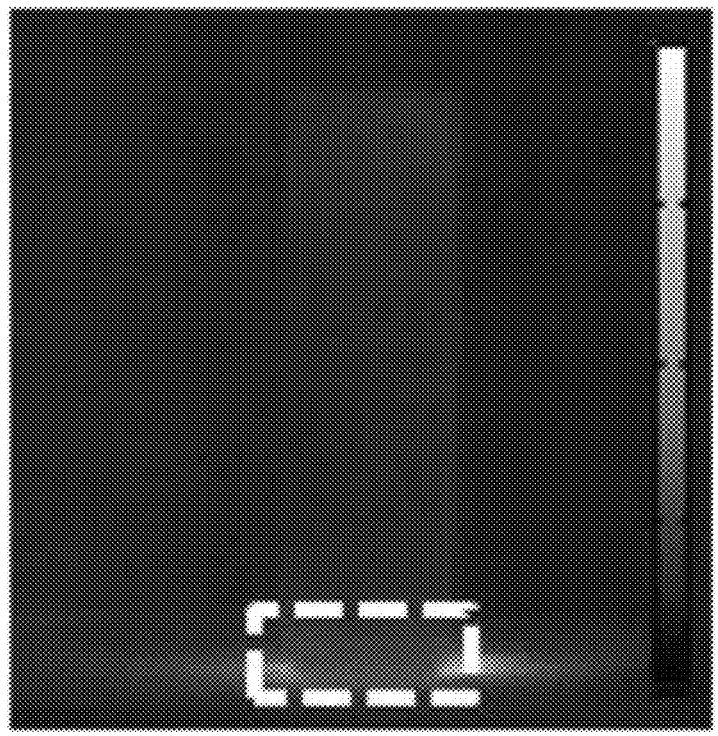
FIG. 12B illustrates an infrared image of a membrane according to an embodiment of the present disclosure which is located at the bottom of water contained in a steam generator and is irradiated with light.
Figure 13:
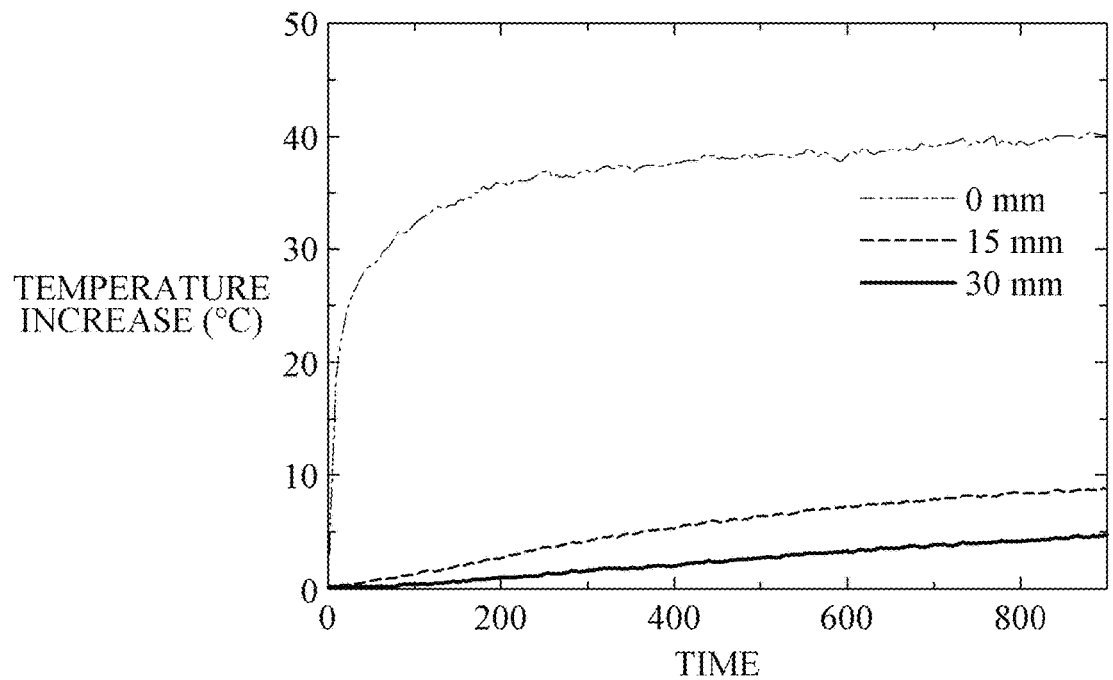
FIG. 13 illustrates water temperature differences dependent upon an installation depth of a membrane according to an embodiment of the present disclosure.
Figure 14:
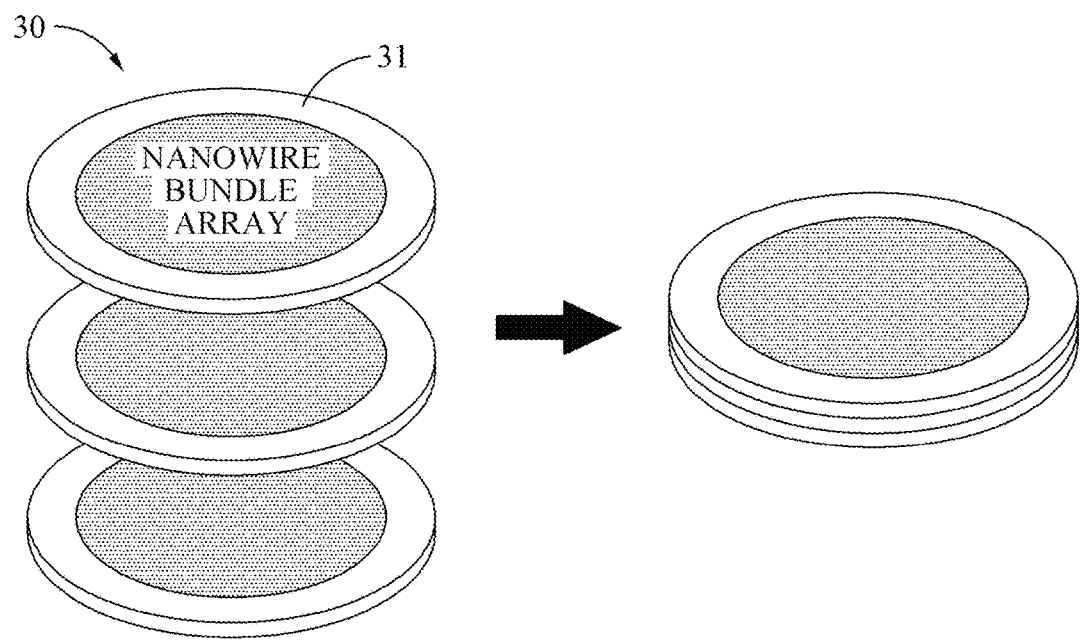
FIG. 14 illustrates a state in which plural membranes according to an embodiment of the present disclosure are stacked.

FIG. 11 schematically illustrates the structures of a steam generator and a membrane according to an embodiment of the present disclosure;

FIG. 12A illustrates an infrared image of a membrane according to an embodiment of the present disclosure which floats on water contained in a steam generator and is irradiated with light, and FIG. 12B illustrates an infrared image of a membrane according to an embodiment of the present disclosure which locates at the bottom of water contained in a steam generator and is irradiated with light;

FIG. 13 illustrates water temperature differences dependent upon an installation depth of a membrane according to an embodiment of the present disclosure; and FIG. 14 illustrates a state in which a plurality of membranes according to an embodiment of the present disclosure are stacked.

Referring to FIGS. 11 to 14, the membrane 30 according to an embodiment of the present disclosure may include the nanowire bundle array 1, which includes the nanowire assemblies 10 bonded to each other, and the porous support 31, which supports the nanowire bundle array 1, as illustrated in FIG. 3D or 4B.

The porous support 31 may be formed of a hydrophilic material that absorbs water well. Inside the porous support 31, the microchannels 311 through which water flows may be formed. An end of each of the microchannels 311 may be connected to a lower part of the porous support 31 and another end of each porous support 31 may be connected to an upper part of the porous support 31. Water at the lower part of the porous support 31 may flow to the upper part of the porous support 31 via the microchannels 311.

One surface of the porous support 31 may include an adhesive material. By such an adhesive material, the nanowire bundle array 1 may be attached to the porous support 31. For example, the porous support 31 may be a porous adhesive tape. More preferably, the porous support 31 may be 3M Micro pore Surgical Tape 1530S-1.

The porous support 31 preferably floats on a surface of water. When the porous support 31 sufficiently absorb water, internal air of the microchannels 311 inside the porous support 31 is discharged to the outside, the microchannels 311 are filled with water, and water at a lower part of the porous support 31 may be continuously drawn to an upper surface of the porous support 31 by capillary force. Such water flow via the microchannels 311 allows continuous water supply and continuous steam generation.

In addition, the porous support 31 preferably has a small density such that the porous support 31 can float on a surface of water.

The steam generator 40 according to an embodiment of the present disclosure may include a body part 41, and the membrane 30 that can float on water contained in the body part 41.

The body part 41 may have a cylindrical shape to contain water in the interior thereof. An upper part of the body part 41 is preferably open such that sunlight can be trapped in the interior thereof.

In addition, an insulating member 42 may be provided around the body part 41 to prevent heat from being released to the outside. For example, the insulating member 42 may be made of a Styrofoam material.

In accordance with the steam generator 40 of the present disclosure, when light is applied to the membrane 30 floating on water, i.e., the nanowire bundle array 1 on the porous support 31 floating on water, heating locally occurs and thus water continuously supplied through the microchannels 311 of the supporter 31 can continuously evaporate.

Referring to FIGS. 12A, 12B and 13, it can be confirmed that, when the membrane 30 floats on an upper part of water, i.e., a surface of water, the effect of such local heating is greater, as compared to when the membrane 30 is located at a bottom of water or underwater.

Meanwhile, referring to FIG. 14, the membrane 30 may be formed by stacking multiple membranes 30 in a vertical direction and binding the same. The temperature of a locally heated part may increase with increasing number of the membranes 30 bound in a vertical direction.

As such, when light is irradiated in a state in which the membrane 30 including the nanowire bundle array 1, in which a plurality of the nanowire assemblies 10 are arranged or the nanowire assemblies 10 are bound to each other and thus various sizes of nanogaps are formed, floats on a surface of the steam generator 40, wide broadband wavelengths of light may be absorbed although the intensity of the light is small. Accordingly, steam can be continuously generated using continuous water supply through the porous support 31 and local heating of the membrane 30.

In other words, the porous support 31 (tape), which has high absorption heat at a broadband, focuses heat energy on a surface through increase of electromagnetic field in nanoscale areas, and floats on water to allow continuous water supply, may prevent heat from being lost to the entirety of water.

Resultantly generated steam can be usefully used in water purification and sterilization and power plants.

As apparent from the above description, solar heat can be converted with high efficiency and steam can be efficiently generated.

In addition, in accordance with present disclosure, light is converted to heat using a maximum solar spectrum area from a visible light area to an infrared light area, and thus, more solar energy can be used in boiling water.

In addition, in accordance with the present disclosure, the absorption rate of light is high and the reflection rate thereof is low, thereby decreasing loss of sunlight.

Further, in accordance with the present disclosure, water can be rapidly vaporized and the vaporized steam can be prevented from being liquefied again.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

DESCRIPTION OF SYMBOLS

10: NANOWIRES BUNDLE
11: NANOWIRE
12: INTERVAL, NANOGAP
20: BASE SUBSTRATE
30: MEMBRANE
31: SUPPORTER
311: MICROCHANNEL
40: STEAM GENERATOR
41: BODY PART
42: INSULATING MEMBER

What is claimed is:

1. A nanowire bundle array, wherein a plurality of nanowire assemblies are arranged in the nanowire bundle array, wherein each of the nanowire assemblies comprises a plurality of nanowires, wherein at least a portion of the nanowires is coated with a thin metal film and widths between the nanowires decrease from one end part of the nanowires to another end part of the nanowires,
  wherein light in a wavelength range from visible light to infrared light is absorbed by the nanowire bundle array and thus the nanowire bundle array is observed to be black by an observer due to the visible light being absorbed by the nanowire bundle array and, when light is irradiated onto the nanowire bundle array, heat is generated by surface plasmon resonance heating.

2. The nanowire bundle array according to claim 1, wherein a portion of the nanowire assembly is spaced from another nanowire assembly by a predetermined interval.

3. The nanowire bundle array according to claim 1, wherein the nanowires comprise:
  a nanowire body part made of an alumina material; and
  a thin metal film comprising at least one selected from the group consisting of gold, silver, titanium, nickel, aluminum, palladium, platinum, titanium oxide, and titanium nitride.

4. The nanowire bundle array according to claim 1, wherein each of nanowires comprised in the nanowire assembly is collapsed in a predetermined direction and supported by neighboring nanowires.

5. The nanowire bundle array according to claim 1, wherein the nanowire is bound to any one of the nanowires comprised in the nanowire assembly by capillary force of a liquid present between the nanowires.

6. The nanowire bundle array according to claim 1, wherein the nanowires are bound at one end of the nanowire assembly and spaced from each other at another end of the nanowire assembly.

7. The nanowire bundle array according to claim 6, wherein an upper part of the nanowire assembly forms an upwardly protruding peak and a dented valley is formed between any one of the nanowire assemblies and another neighboring nanowire assembly.

8. The nanowire bundle array according to claim 1, wherein the nanowires comprised in the nanowire assembly are made of a flexible material, at least a portion of at least one of the nanowires is bent, and, in the bent state, the nanowire is bound to another nanowire.

9. The nanowire bundle array according to claim 1, wherein the nanowire assembly forms a funnel structure,
  intervals between the nanowires of the nanowire assembly are formed at nanoscale, and
  the nanowire assembly is formed to a microscale height and width and a plurality of the nanowire assemblies is disposed in the nanowire bundle array.

10. The nanowire bundle array according to claim 9, wherein intervals between the nanowires are less than 500 nm, a height of the nanowire assembly is 100 nm to 30 μm, and intervals between the nanowire assemblies are 1 μm to 70 μm.

11. The nanowire bundle array according to claim 1, wherein the nanowire assemblies are spaced at a predetermined interval and formed in a vertical direction, and the nanowire assemblies, which locate at one and another sides, of the nanowire assembly are collapsed and, accordingly, bind with other nanowire assemblies.

12. A membrane, comprising:
  a porous support; and
  nanowire assemblies, each of which comprises a plurality of nanowires and which have a shape wherein widths between the nanowires gradually decrease from one end to another end,
  wherein a plurality of the nanowire assembly is disposed at microscale, thereby forming a nanowire bundle array,
  wherein the nanowires are supported by the porous support and at least a portion of the nanowires is coated with a thin metal film, and
  wherein the supporter comprises microchannels through which a fluid flows, and when light is irradiated to the nanowire bundle array, the fluid transferred to the nanowire bundle array via the microchannels is heated.

13. The membrane according to claim 12, wherein an adhesive material is provided on at least one side of the supporter and the nanowires bundle is attached to the supporter by the adhesive material.

* * * * *